United States Patent
Davies et al.

(10) Patent No.: US 9,209,601 B2
(45) Date of Patent: Dec. 8, 2015

(54) MONOLITHICALLY INTEGRATED TUNABLE SEMICONDUCTOR LASER

(71) Applicant: OCLARO TECHNOLOGY LTD, Northamptonshire (GB)

(72) Inventors: Sam Davies, Northamptonshire (GB); Neil David Whitbread, Northamptonshire (GB); Andrew John Ward, Northamptonshire (GB); Robert Griffin, Towcester (GB)

(73) Assignee: OCLARO TECHNOLOGY LTD, Northamptonshire (GB)

(*) Notice: Subject to any disclaimer, the term of this patent is extended or adjusted under 35 U.S.C. 154(b) by 0 days.

(21) Appl. No.: 14/480,095

(22) Filed: Sep. 8, 2014

(65) Prior Publication Data

US 2015/0010033 A1    Jan. 8, 2015

Related U.S. Application Data

(63) Continuation-in-part of application No. 14/240,545, filed as application No. PCT/GB2012/052086 on Aug. 24, 2012.

(30) Foreign Application Priority Data

Aug. 26, 2011    (GB) .................................. 1114822.8

(51) Int. Cl.
*H01S 3/10* (2006.01)
*H01S 5/0625* (2006.01)
*H01S 5/026* (2006.01)

(52) U.S. Cl.
CPC ............. *H01S 5/06256* (2013.01); *H01S 5/026* (2013.01)

(58) Field of Classification Search
CPC ............ H01S 5/026; H01S 5/125; H01S 3/08

USPC ........................................................... 372/20
See application file for complete search history.

(56) References Cited

U.S. PATENT DOCUMENTS 5,379,318 A * 1/1995 Weber ............................ 372/96
6,345,135 B1    2/2002 Reid et al.
(Continued)

FOREIGN PATENT DOCUMENTS

| EP | 1 298 767 A2 | 4/2003 |
| EP | 1 413 023 | 4/2004 |
| EP | 1 729 381 A1 | 12/2006 |
| EP | 1 850 429 A1 | 10/2007 |

OTHER PUBLICATIONS

Intellectual Property Office of the United Kingdom, Patents Act 1977: Search Report under Section 17(5), United Kingdom Patent Application No. 1114822.8, Dec. 15, 2011, four pages.

(Continued)

*Primary Examiner* — Tuan Nguyen
(74) *Attorney, Agent, or Firm* — Fenwick & West LLP

(57) ABSTRACT

A monolithically integrated, tunable semiconductor laser with an optical waveguide, comprising a laser chip having epitaxial layers on a substrate and having first and second reflectors bounding an optical gain section and a passive section, wherein at least one of the reflectors is a distributed Bragg reflector section comprising a grating and configured to have a tunable reflection spectrum, wherein the laser is provided with a common earth electrode, wherein control electrodes are provided on the optical waveguide in at least the optical gain section and the at least one distributed Bragg reflector section, wherein the passive section is provided with an electrode or electrical tracking on the optical waveguide, the passive section is configured not to be drivable by an electrical control signal, and no grating is present within the passive section.

16 Claims, 10 Drawing Sheets

(56) References Cited

U.S. PATENT DOCUMENTS

| | | |
|---|---|---|
| 7,145,923 B2 | 12/2006 | Carter et al. |
| 7,161,725 B2 | 1/2007 | Fraser et al. |
| 7,394,838 B2 | 7/2008 | Borley et al. |
| 2003/0185256 A1 | 10/2003 | Aoki |
| 2004/0174915 A1* | 9/2004 | Sarlet et al. .................... 372/20 |
| 2004/0218638 A1 | 11/2004 | Carter et al. |
| 2010/0103963 A1 | 4/2010 | Fujiwara et al. |
| 2011/0235659 A1* | 9/2011 | Fukuda .......................... 372/20 |

OTHER PUBLICATIONS

Patent Cooperation Treaty, International Search Report and Written Opinion, International Patent Application No. PCT/GB2012/052086, Feb. 27, 2013, seventeen pages.

Koren, U., et al., "A 1.3-μm Wavelength Laser with an Integrated Output Power Monitor Using a Directional Coupler Optical Power Tap," IEEE Photonics Technology Letters, vol. 8, No. 3, Mar. 1996, pp. 364-366 (XP 000582823).

* cited by examiner

MONOLITHICALLY INTEGRATED TUNABLE SEMICONDUCTOR LASER

CROSS-REFERENCE TO RELATED APPLICATIONS

This application is a continuation in part of U.S. application Ser. No. 14/240,545, filed Feb. 24, 2014, which is a 371 of International Application No. PCT/GB2012/052086, filed Aug. 24, 2012, which claims priority to United Kingdom Application No. 1114822.8, filed on Aug. 26, 2011, each of which are incorporated by reference in their entirety.

FIELD OF DISCLOSURE

The present invention relates to wavelength tunable, monolithically integrated semiconductor lasers having a tunable distributed Bragg reflector, more particularly to such lasers for use in telecommunications applications.

BACKGROUND

Monolithically integrated semiconductor tunable lasers are widely used in the telecommunications industry for transmitting optically modulated light along optical fibres. Commonly, in such applications, the optical signals of many lasers are wavelength division multiplexed (WDM) or densely wavelength division multiplexed (DWDM) with transmission on standardised transmission channels. Two principal telecommunications bands, namely the C Band (191.6-196.2 THz) and the L Band (186.4-191.6 THz), have standard wavelength channels defined by the International Telecommunications Union (ITU) at spacings of 100 GHz (0.8 nm), 50 GHz (0.4 nm), or 25 GHz (0.2 nm). As well as requiring stability in the transmission wavelength, such wavelength multiplexed systems require the transmitting lasers to have a narrow linewidth. Laser linewidth is particularly significant in coherent transmission systems, in which a laser is provided both in the transmitter and in the receiver of each transmission link.

Historically, simple single longitudinal mode lasers with short lasing cavities were widely deployed and capable of operation on only one channel or tunable across a small number of channels, with their operating wavelengths being thermally stabilised through control of the operating temperature of each laser. However, more recently, lasers that are widely wavelength tunable have found favour with network providers. U.S. Pat. No. 7,145,923 describes such a design of widely tunable laser.

The lasing cavities of widely tunable lasers require a pair of lengthy, tunable distributed Bragg reflector sections (DBRs), a gain section and a phase control section on a common waveguide, in order to operate on a single longitudinal cavity mode. The DBRs are provided by gratings within the optical waveguide of the laser, and are tuned to control the lasing wavelength of the laser cavity. However, these DBR sections increase the length of the laser cavity, which results in more closely spaced longitudinal modes of the laser cavity. Effective transmission of an optical signal requires uninterrupted transmission on a single, wavelength stabilised longitudinal mode with a high level of discrimination between the intensity of the dominant lasing mode and unwanted side modes. To provide a high level of side mode suppression (i.e. a high side mode suppression ratio, SMSR) it has been necessary to minimise the length of the optical cavity of the laser. To reduce electrical interference, narrow electrical isolation regions are provided between the control electrodes that are over adjacent sections of the laser. The length (along the waveguide) of such isolation regions is kept to a minimum, being no more than a few μm (i.e. significantly less than 20 μm).

The present inventors have identified that, disadvantageously, the requirement for short laser cavities results in the production of optical outputs from the lasers with significant linewidths, commonly having a linewidth dominated by the population of photons within the laser cavity and by the round trip time of the laser cavity.

SUMMARY OF THE DISCLOSURE

According to a first aspect, there is provided a monolithically integrated, tunable semiconductor laser with an optical waveguide, comprising a laser chip having epitaxial layers on a substrate and having
    first and second reflectors bounding
    an optical gain section and
    a passive section,
    wherein at least one of the reflectors is a distributed Bragg reflector section comprising a grating and configured to have a tunable reflection spectrum,
    wherein the laser is provided with a common earth electrode,
    wherein control electrodes are provided on the optical waveguide in at least the optical gain section and the at least one distributed Bragg reflector section,
    wherein the passive section is provided with an electrode or electrical tracking on the optical waveguide, the passive section is configured not to be drivable by an electrical control signal, and no grating is present within the passive section.

Advantageously, the lasers of the present invention may have a reduced linewidth/phase noise, compared with known devices.

According to a second aspect, there is provided a monolithically integrated, tunable semiconductor laser with an optical waveguide, comprising a laser chip having epitaxial layers on a substrate and having first and second reflectors bounding an optical gain section and a grounded passive section, wherein at least one of the reflectors is a distributed Bragg reflector section comprising a grating and configured to have a tunable reflection spectrum, wherein the laser is provided with a common earth electrode, wherein control electrodes are provided on the optical waveguide in at least the optical gain section and the at least one distributed Bragg reflector section, wherein the grounded passive section is provided with a grounded electrode on the optical waveguide that is electrically connected to the common earth electrode, and no grating is present within the grounded passive section.

According to a third aspect, there is provided a monolithically integrated, tunable semiconductor laser having an optical gain section, an optical phase control section, and a grounded passive section bounded at one end by a tunable first Bragg reflector in the form of a distributed Bragg reflector adapted to produce a comb of reflective peaks and at the other end by a tunable second distributed Bragg reflector, the second distributed Bragg reflector being adapted to reflect at a plurality of wavelengths, wherein one or more wavelengths of reflective peaks of the first distributed Bragg reflector substantially coincide with one or more wavelengths at which the tunable second distributed Bragg reflector reflects prior to each of the first and second distributed Bragg reflectors being tuned, and wherein the second distributed Bragg reflector is capable of being tuned selectively through discrete segments so that one or more segments of the second distributed Bragg reflector can be tuned to a lower wavelength to reflect with a further segment of the second distributed Bragg reflector reflecting at that lower wavelength to enhance the reflectivity at that lower wavelength, the lower wavelength substantially coinciding with a peak of the first distributed Bragg reflector, thereby capable of causing the laser to lase at that lower wavelength, wherein the passive section is provided with an electrode or electrical tracking on the optical waveguide, the passive section is configured not to be drivable by an electrical control signal, and no grating is present within the passive section.

According to a fourth aspect, there is provided a monolithically integrated, tunable semiconductor laser array comprising a plurality of lasers according to the first or second aspect that are optically coupled to a common optical output.

According to a fifth aspect, there is provided an optical transmitter module comprising a monolithically integrated, tunable semiconductor laser or a monolithically integrated, tunable semiconductor laser array according to the first, second or third aspect and control electronics configured to control the operation of the laser or laser array.

The passive section may be a grounded passive section in which the electrode is a grounded electrode that electrically contacts the passive section and is electrically connected to the common earth electrode.

Advantageously, the grounded passive section may reduce the contribution to the linewidth/phase noise from shot noise.

The common earth electrode may be provided on the substrate, the common earth electrode may be bonded to a mounting element electrode provided on a mounting element, and the grounded electrode may be electrically connected to the mounting element electrode.

An electrically insulating layer may be provided on the optical waveguide in the passive section, and the electrode or electrical tracking may be provided on the electrically insulating layer.

The grounded passive section may comprise a p-i-n doped epitaxial structure.

The laser may comprises a substrate, a lower layer on the substrate, an overgrowth layer and an optical guiding layer between the lower layer and the overgrowth layer,
wherein the optical waveguide has an optical phase control section bounded by the first and second reflectors, and
the phase control section and the passive section comprises a common overgrowth layer and/or lower layer.

The laser may comprise a plurality of passive sub-sections.

A reflector is an output reflector that is configured for optical output from the laser, and the passive section or a passive sub-section may be located between the optical gain section and the output reflector.

The optical waveguide may have an optical phase control section bounded by the first and second reflectors. The passive section or a passive sub-section may be located between the optical gain section and the optical phase control section.

The passive section may have a length of at least 100 µm. The passive section may have a length of at least 150 µm. The passive section may have a length of at least 200 µm. The passive section may have a length of at least 400 µm.

The control electronics may comprise a control loop configured to sample the wavelength of light output from the laser or laser array and to provide electrical feedback to control electrodes provided on the laser or laser array. Advantageously the electrical feedback is for stabilising the wavelength and/or active suppression of linewidth/phase noise.

DETAILED DESCRIPTION

Figure 1A:
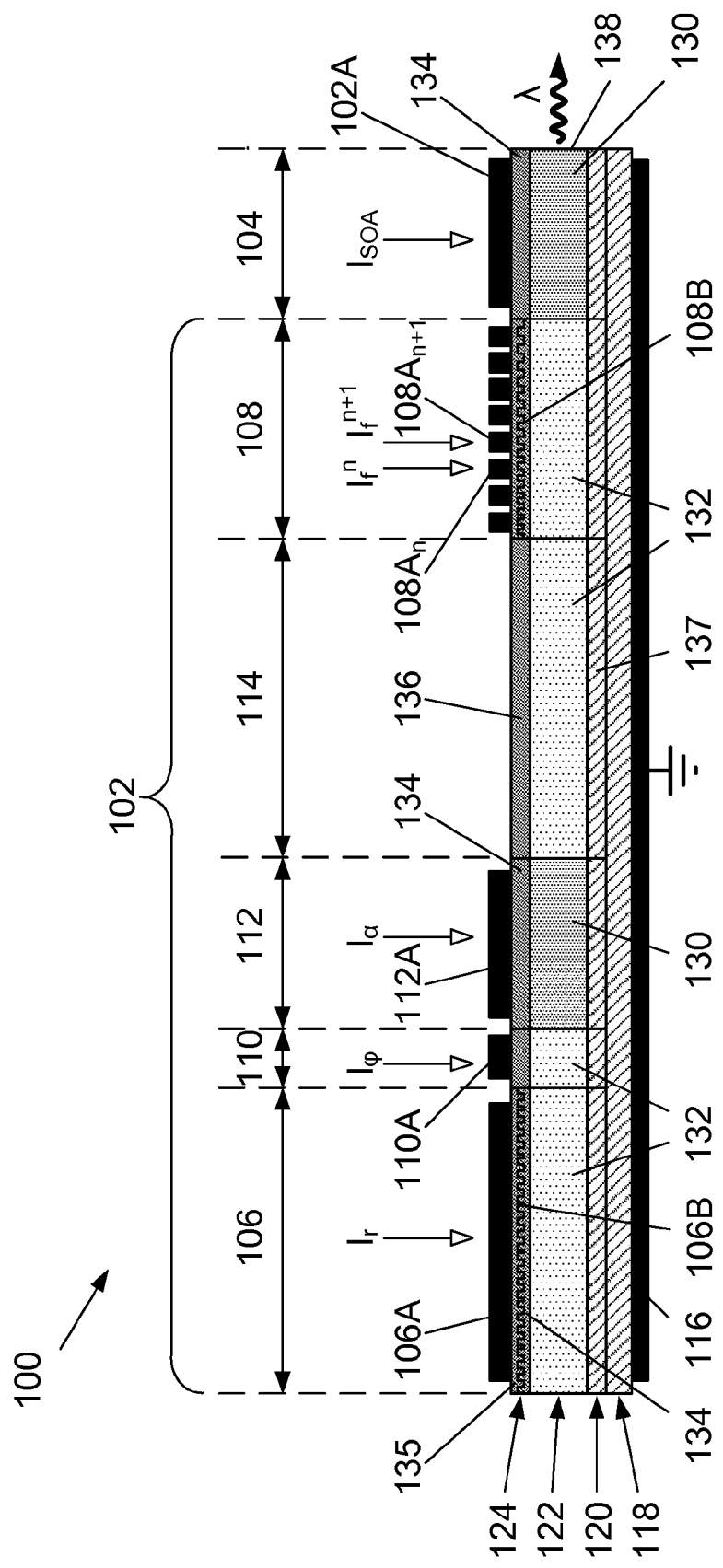
FIG. 1A illustrates a schematic cross-sectional view of a semiconductor chip comprising a tunable semiconductor laser optically integrated on a common optical waveguide with a semiconductor optical amplifier, having a passive section and a phase control section.

In the drawings, like features have been identified with like numerals, albeit in some cases having one or more of: increments of integer multiples of 100. For example, in different figures, 100, 200, 300, 400, 500, 600, 700 and 800 have been used to indicate an optoelectronic semiconductor chip.

FIG. 1A illustrates a schematic cross-sectional view of an optoelectronic semiconductor chip 100 having a tunable semiconductor laser 102 optically integrated on a common optical waveguide with a semiconductor optical amplifier (SOA) 104, which is outside the cavity of the laser. The laser 102 has first and second distributed Bragg reflector (DBR) sections 106 and 108 bounding a phase control section 110, an optical gain section 112 and a passive section 114. The sections 106, 108, 110, 112 and 114 of the laser 102 are monolithically integrated on the common semiconductor chip 100.

The chip 100 is provided with a common earth electrode 116 (also referred to as the "back electrode") onto the substrate 118. The first DBR section 106, the phase control section 110, the optical gain section 112, and the SOA 104 are provided with respective electrical control electrodes, 106A, 110A, 112A and 104A. The first DBR section 106 comprises a reflective Bragg grating 106B that produces a reflection spectrum with a comb of reflective peaks. The second DBR section 108 comprises a reflective Bragg grating 108B with a monotonically chirped grating pitch, with respective sub-electrodes $108A_1$, $108A_2$, etc. provided on segments of the second DBR section arranged along the optical waveguide. No electrode is provided onto the passive section 114 (i.e. the passive section is configured not to be electrically controlled by injection of current into that portion of the optical waveguide passing through the passive section).

As is conventional in optoelectronic structures, the chip 100 comprises a common substrate 118 and a series of epitaxially grown layers successively built up on the substrate, being a lower layer 120, an optical guiding layer 122, and an overgrowth layer 124. Further layers may also be provided (e.g. a patterned layer of highly doped material may be provided beneath the electrodes, and the electrodes may be deposited through windows patterned in an electrically insulating layer, both omitted from FIGS. 1A and 1B for clarity), and each layer may comprise a plurality of layers.

A ridge optical waveguide (not shown) is formed by etching a ridge into at least the surface of the chip 100 opposite to the substrate 118, and the ridge optical waveguide provides lateral guiding of light within the laser 102 and SOA 104. In the case of a shallow ridge waveguide, it may be etched only part way through the overgrowth layer 124. In the case of a deeper ridge waveguide, it may be etched through the overgrowth layer 124, the optical guiding layer 122 and into the lower layer 120. The ridge waveguide is dimensioned to support only a single transverse optical mode of the lasing wavelength, including within the passive section 114.

The optical guiding layer 122 is intrinsic, undoped semiconductor material (i.e. not intentionally doped, i-type), and the optical guiding layer has a higher refractive index than the lower layer 120 or the overgrowth layer 124. In at least the electrically drivable sections of the laser 106, 108, 110 and 112 (i.e. the sections configured to be electrically driven by current injection, in contrast to the passive section 114, which is not configured to be electrically drivable), the lower layer 120 is doped with dopants of a first type (e.g. n-type). Similarly, in at least the electrically drivable sections of the laser 106, 108, 110 and 112, the overgrowth layer 124 is doped with dopants of the opposite, second type (e.g. p-type). Accordingly, at least the electrically drivable sections of the laser 106, 108, 110 and 112 comprise p-i-n doped epitaxial structures.

The optical gain section 112 of the laser and the SOA 104 comprise an optical guiding layer 122 formed of a first material 130. The first and second DBR sections 106 and 108, and the phase control section 110 comprise an optical guiding layer formed of a second material 132, to optimise their respective optical and electrical performance. The first material 130 is configured for being electrically driven by carrier injection to emit photons, in particular by stimulated emission, thereby amplifying light that passes through the corresponding sections 112 and 104. The second material 132 is configured for being electrically driven by carrier injection to produce a refractive index change within the corresponding section 106, 108 and 110. With the exception of the passive section 114, the laser 102 and SOA 104 are provided with an overgrowth layer 124 comprising a common third material 134 of the second dopant type (e.g. p-type). In the DBR sections 106 and 108, the gratings 106B and 108B are formed by a corrugated boundary between materials having a different refractive index, being formed by etching a corrugated pattern into one material before overgrowing with a different material (e.g. in FIG. 1A, a corrugated pattern is etched into the third material 134 before overgrowing with the further material 135, which is also of the second dopant type).

The passive section 114 comprises an overgrowth layer 124 of material 136 of the second dopant type (e.g. p-type). The passive section 114 comprises a lower layer 120 of material 137 of the first dopant type (e.g. n-type).

The material 136 of the overgrowth layer 124 and/or the material 137 of the lower layer 120 within the passive section 114 may alternatively or additionally be undoped (i.e. not intentionally doped. The provision of undoped material 136 or 137 within the passive section 114 may reduce optical absorption within the passive section, enhancing laser performance. The material 136 of the overgrowth layer 124 may be grown by a selective area growth (SAG) epitaxial growth process, particular in the case that it differs from the material of the overgrowth layer in the electrically drivable sections 106, 108, 110 and 112.

In use, current passed between each of the electrodes on the separate sections (e.g. the electrodes on the gain section 112, phase section 110 and on the first DBR section 106 and the segmented electrodes on the DBR segments of the second DBR section 108) and the back electrode 116, typically spreads along the length of the optical waveguide by a few µm (i.e. less than 20 µm). The extent of this current spreading is dependent upon the epitaxial structure of the corresponding sections. Accordingly, the gain section electrode 112A and phase section electrode 110A may stop short of the edges of the gain section 112 and phase section 110, to allow for corresponding electrical isolation gaps 113, as is more clearly illustrated in FIG. 1B, which shows the portion of the laser 102 bounded between the first and second DBRs 106 and 108. The figures are schematic and not to scale, and accordingly exaggerate both the thickness of the epitaxially grown layers and the width of the electrical isolation gaps, for clarity. The epitaxial layers 120, 122 and 124 built up on the substrate 118 are typically tens of nanometers thick, whilst the laser cavity is typically many millimeters long.

The passive section 114 is a non-driven region 115 of the optical waveguide within the laser cavity that is not configured to be electrically controlled, i.e. no electrical contact is provided to the upper surface. The passive section 114 has a different epitaxial structure to the gain section 112, in respect of at least one epitaxial layer. Further, the passive waveguide section 114 is configured such that substantially no drive current may be passed through the optical guiding layer 122 of the passive waveguide section within the passive section, i.e. it is spaced apart from the portion of the gain section 112 covered by the gain section electrode 112A by a narrow electrical isolation gap 113.

The electrical isolation gaps 113 are parts of gain section 112 and phase control section 110 that are not provided with a covering electrical contact on the epitaxially grown side of the chip 100 (i.e. on the side of the chip opposite to the substrate, as opposed to any common earth electrode provided onto the substrate side of the chip in the electrical isolation gaps). Accordingly, the gain section 112 and phase control section 110 each comprise a driven region and non-driven regions 113 and 115 of the optical waveguide within the laser cavity, the driven and non-driven regions of the same section having the same epitaxial structure, and respectively being provided and not being provided with covering electrical contacts 112A and 110A on the epitaxially grown side of the chip 100. Although no electrical contact is made onto the electrical isolation gap (on the epitaxially grown side of the chip), in use, the current that passes from the gain section electrode 110A and the phase control section electrode 112A through the optical guiding layer 122 to the common earth electrode 116, will spread a little along the optical waveguide. The electrical isolation gaps 113 are at least wide enough for current that has spread into one side (adjacent the electrode) to be substantially zero at the other side (along the waveguide from the electrode).

Accordingly, the laser 102 has a composite non-driven region 115 within the optical waveguide of the lasing cavity, between the end reflectors of the laser cavity (e.g. between the first and second DBRs 106 and 108). The composite non-driven region 115 is provided without a directly covering electrical contact on the epitaxial growth side of the chip, comprising the passive section 114 and the electrical isolation gaps 113.

Figures 1B, 1C:
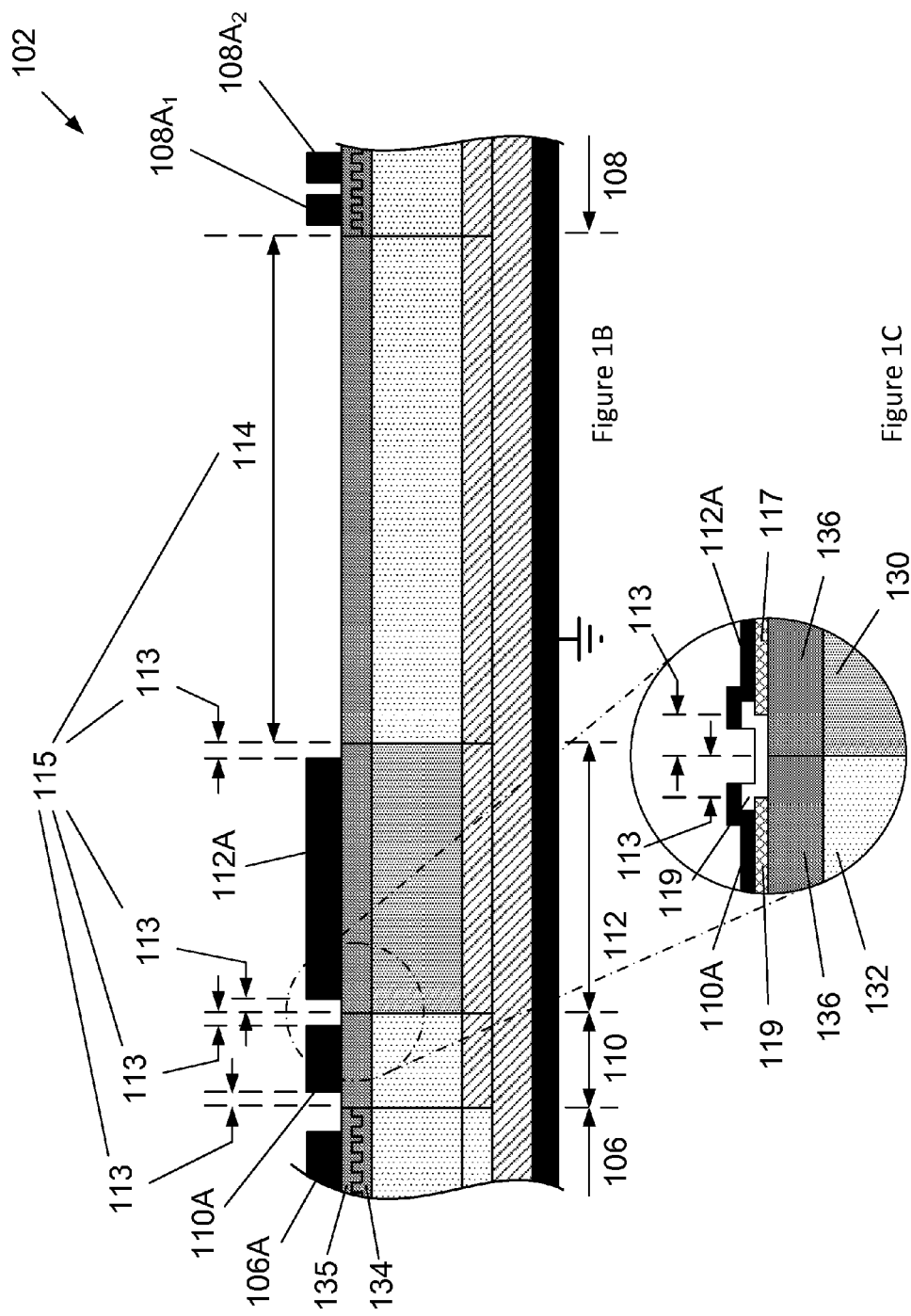
FIG. 1B shows an enlarged view of part of FIG. 1A.
FIG. 1C shows an enlarged view of part of FIG. 1B.

For clarity, in FIGS. 1A and 1B, the electrodes 106A, $108A_n$, 110A and 112A have been shown contacting directly onto the overgrowth layer 124. However, typically electrodes are provided onto contact regions 117 of a highly doped semiconductor contact layer, which the electrodes contact through windows etched in an electrically insulating dielectric layer 119, as is shown in the expanded view of FIG. 10. In this case, the extent of the electrical contact to the respective section is provided by the length of the respective contact region 117 (along the optical waveguide).

Accordingly, bounded by the first DBR section 106 and the second DBR section 108, the optical cavity of the laser 102 is provided with a non-driven region 115 (that is an assembly of sub-regions that are not all adjacent) that is not provided with an electrical contact (either a metal electrode or highly doped contact region) or a grating, composed of electrical isolation gaps 113 and the passive waveguide section 114. The composite non-driven region 115 has a length of at least 100 μm. The passive section 114 alone may have a length of at least 100 μm.

In FIGS. 1A, 1B and 1C, the passive section 114 has a length of 100 μm and each electrical isolation gap 113 has a length of 10 μm (so that the separation between the gain section electrode 112A and the phase section electrode 110A is 20 μm), such that the non-driven region 115 has a length of 140 μm.

Figure 1D:
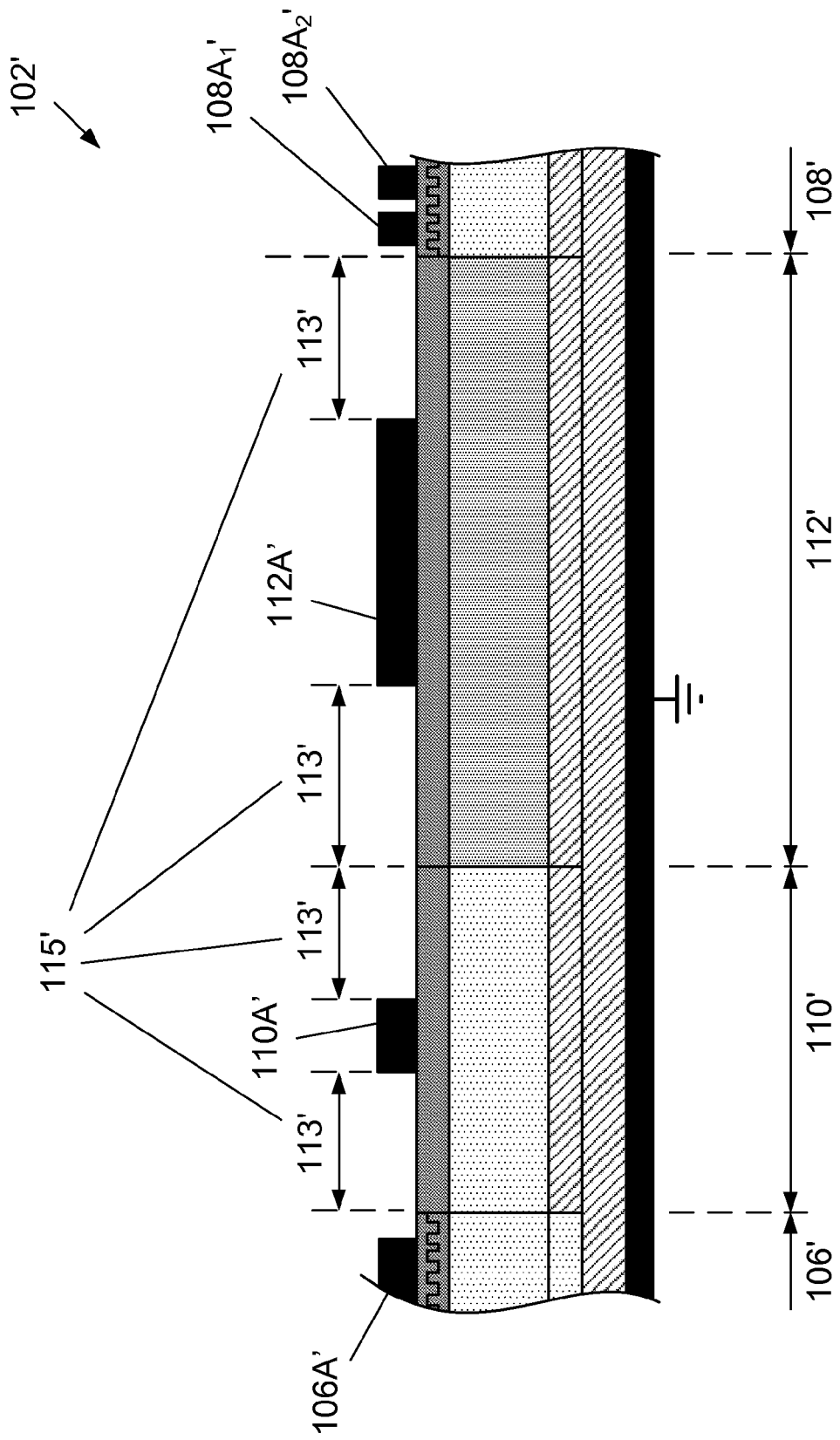
FIG. 1D illustrates a schematic cross-sectional view of part of a semiconductor chip comprising a tunable semiconductor laser, having lengthy electrical isolation gaps and a phase control section.

FIG. 1D illustrates an alternative arrangement, in which a separate passive section is not provided between the first and second DBR sections 106' and 108'. In contrast, the electrical isolation gaps 113' are larger than the electrical isolation gaps 113 of FIG. 1B, such that they extend well beyond the necessary width for current spread from the respective electrodes 112A' and 110A' to reduce to zero. Accordingly, the non-driven region 115' comprises a plurality of electrical isolation gaps 113', and no epitaxially distinct passive section, and the benefit of narrower linewidth in the light output from the laser 102' may be provided without a separate passive section by use of at least one electrical isolation gap that is longer than required for just the purpose of electrical isolation of adjacent regions beneath control electrodes.

The non-driven region has a length of at least 100 μm, and may have a length of at least 150 μm, at least 200 μm or at least 400 μm.

The passive section is at least 100 μm in length, and may have a length of at least 150 μm, at least 200 μm or at least 400 μm. In particular, lasers manufactured with passive sections of 450 μm and 900 μm length have been found to provide substantially lower Lorentzian linewidths than corresponding lasers without passive sections within the optical cavity of the laser.

In use (with reference to FIG. 1A), the first DBR 106, phase control section 110, gain section 112 and at least some of the segments of the second DBR 108 are driven with respective currents $I_r$, $I\phi$, $I\alpha$, $I_f^n$ and $I_f^{n+1}$. The SOA 104 is also driven with a current $I_{SOA}$, and amplifies the intensity of the light that is output from the optical cavity of the laser 102 through the partially reflective second DBR 108, before the light is emitted through an output facet 138 of the chip 100.

The optical cavity of the laser 102 extends between the DBR sections 106 and 108, and penetrates into the DBR sections in accordance with the penetration distance of each DBR section, which in turn is dependent upon the strength of the grating 106B and 108B in each section (it is noted that alternatively one of the end reflectors of the laser cavity may be a reflective facet of the chip, for which there is no significant penetration distance). The presence of the length of the non-driven region 115 (including the passive section 114) within the lasing cavity of the laser 102 provides an increased laser cavity optical path length and consequently an increased round-trip time for photons within the cavity, which reduces the spontaneous emission rate of the photons contributing to the lasing mode, and increases the population of photons within the laser cavity, resulting in the emission of light from the laser cavity that has a reduced Lorentzian linewidth, compared with a corresponding laser cavity without a non-driven region that is longer than necessary simply to provide electrical isolation (e.g. without a passive section).

The first and/or second DBR sections 106 and 108 are longer and have a weaker reflection per unit length than in the lasing cavity of a corresponding laser without such a lengthy non-driven region (e.g. without a passive section). This provides narrower reflective peaks with enhanced mode selectivity, in order to maintain single longitudinal cavity mode operation and to provide an acceptable side mode suppression ratio.

In the exemplary arrangement illustrated in FIG. 1A: The first DBR section (rear DBR section) 106 comprises a phase-change grating 106B producing a reflection spectrum comprising a comb of narrow reflective peaks, such as a grating described in U.S. Pat. No. 6,345,135. The second DBR section (front DBR section) 108 comprises a chirped grating 108B with a pitch that varies continuously and monotonically, and in its un-tuned state produces a reflective peak with a wide, and relatively flat reflection spectrum. That relatively flat reflection spectrum is a composite reflection formed from the reflections of all of the different segments of the second DBR section, each of which individually provides a reflective peak that is significantly broader than each of the reflective peaks of the first DBR section. In use, the reflective peak of one segment of the second DBR section is tuned with respect to wavelength to overlap with that of another segment, to produce a reinforced reflective peak. Where a reflective peak of the first DBR section coincides in wavelength with the reinforced reflective peak of the second DBR section, a longitudinal cavity with lower round trip optical loss is formed, and when sufficient optical gain is provided, the laser primarily lases on a corresponding dominant mode within the wavelength range of low optical loss.

The grating 108B of the second DBR section 108 may alternatively comprise a series of constant pitch steps. Short regions of constant pitch, separated by small pitch steps may be used to approximate to a continuous variation in pitch, with several steps in each segment of the second DBR. Alternatively, the grating within each segment of the second DBR 108 may have a constant pitch.

The lasing wavelength can be wavelength tuned as follows: very fine tuning is provided by thermal tuning with a thermoelectric cooler/heater element (not shown) to control the operating temperature of the chip 100, which tunes the optical path length of the laser cavity; alternatively, or additionally, very fine tuning may be provided by tuning the optical path length of the phase control section 110; fine tuning is provided by tuning the wavelength of the reflective comb of the first DBR 106; and, coarse tuning is provided by additionally tuning the wavelength of the reinforced peak of the second DBR 108, either through tuning the initial segments (closest to the gain section 112), or by alternatively forming a reinforced reflective peak with a different combination of segments of the second DBR 108. In each case the corresponding section of the laser 102 is tuned through carrier injection induced refractive index change. Further discussion of this tuning arrangement is found in U.S. Pat. No. 7,145,923.

During operation of a DBR laser, variations in electrical drive currents passing through sections of the laser arise due to statistical variations in the flow of charge carriers and electrical noise in the driving signals, for example due to electromagnetic interference and/or shot noise. Such drive current variations, and in particular variations in the drive current to the DBR sections (i.e. $I_r$ and $I_f''$), result in variations in the wavelength of the laser output, which increase the linewidth/phase noise of the output light.

The dominant output wavelength of the laser is monitored by an electrical control system comprising a high speed control loop that provides electrical feedback to control electrodes on the laser (e.g. 110A, 106A and/or 108A$_i$). Typically, the output light from the laser is sampled, the sampled beam is split, and one or both of the split beams is passed through a frequency discriminating component (e.g. an etalon) before being received at respective photodetectors. The relative intensities of electrical signals produced by the detected beams incident onto the photodetectors are compared, and used in a control algorithm to control the drive currents to the electrically drivable sections of the laser. U.S. Pat. Nos. 7,161,725 and 7,394,838 provide further details of a known arrangement of optical components for optically sampling the output light from a laser chip and a laser control system.

The phase control section 110 of the laser 102 is electrically driven (by current injection) by a drive current ($I_\phi$) comprising a DC current and a variable correction signal, from the control system to the phase section electrode 110A. The phase control section 110 is shorter than in known monolithic tunable semiconductor lasers. In the illustrated arrangement of FIG. 1A, the phase section is 20 μm long. Accordingly, the control system provides a larger variable correction signal to the phase control electrode than in known devices, which produces a larger refractive index change in the phase control section, in order to produce the required change in optical path length of the shorter phase control section 110.

When current passes through the phase control section 110 it induces optical loss in the laser cavity. The shorter phase control section 110 can be driven with a higher DC current density than in known devices, whilst only inducing comparable optical loss in the laser cavity. Advantageously, driving with a higher DC current density reduces the carrier lifetime (i.e. the average time it takes for a minority charge carrier to recombine) within the phase control section 110, which increases the frequency response bandwidth of the phase control section. The higher frequency response bandwidth enables the short phase control section 110 to respond to a more rapidly varying correction signal from the control system (e.g. the control system provides a correction signal having a bandwidth of at least 50 MHz, and preferably at least 100 MHz). Accordingly, high speed feedback control of the variable correction signal may be used to compensate for variations in the output wavelength of the laser arising as a result of electrical driving signal noise, particularly correcting for noise on the electrical driving signals to the DBR sections 106 and 108. Such high speed correction actively suppresses the linewidth/phase noise of the output light from the laser 102.

The phase control electrode 110A contacts the phase control section 110 along a length of approximately 20 μm (along the length of the optical waveguide of the laser cavity), and the control system is configured to drive the phase control section 110 with a DC current of approximately 3 mA, which provides a frequency response bandwidth of approximately 150 MHz, when the laser is operated with a side mode suppression ratio (the relative intensity of the dominant longitudinal cavity mode of the laser compared with the largest side mode) of at least 40 dB.

In an alternative arrangement, the overgrowth layer 124 in the passive section 114 may comprise a material 136 with the same type of doping as the material 137 of the lower layer 120 in the passive section 114, e.g. n-type material, which may be highly doped. In a yet further alternative, both materials 136 and 137 may be undoped.

The optical guiding layer 122 in the passive section 114 may have a higher refractive index than the optical guiding layer 122 in the electrically drivable laser sections 106, 108, 110 and 112, which would further increase the optical path length of the laser cavity.

In FIG. 1A, a single passive section 114 has been illustrated, which is located between the optical gain section 112 and the (second) DBR section 108, which is partially transmissive and through which light exits the laser cavity towards the output facet 138. That location for the passive section is particularly advantageous, since it is the location in which the greatest optical field strength is present within the laser cavity, in use. However, a passive section may be provided at an alternative location within the laser cavity (i.e. elsewhere between the first and second DBR sections 106 and 108). Further, more than one passive section may be provided. For example, a passive section may alternatively or additionally be provided between the first DBR section and the phase section, or between the phase section and the gain section.

Figure 2:
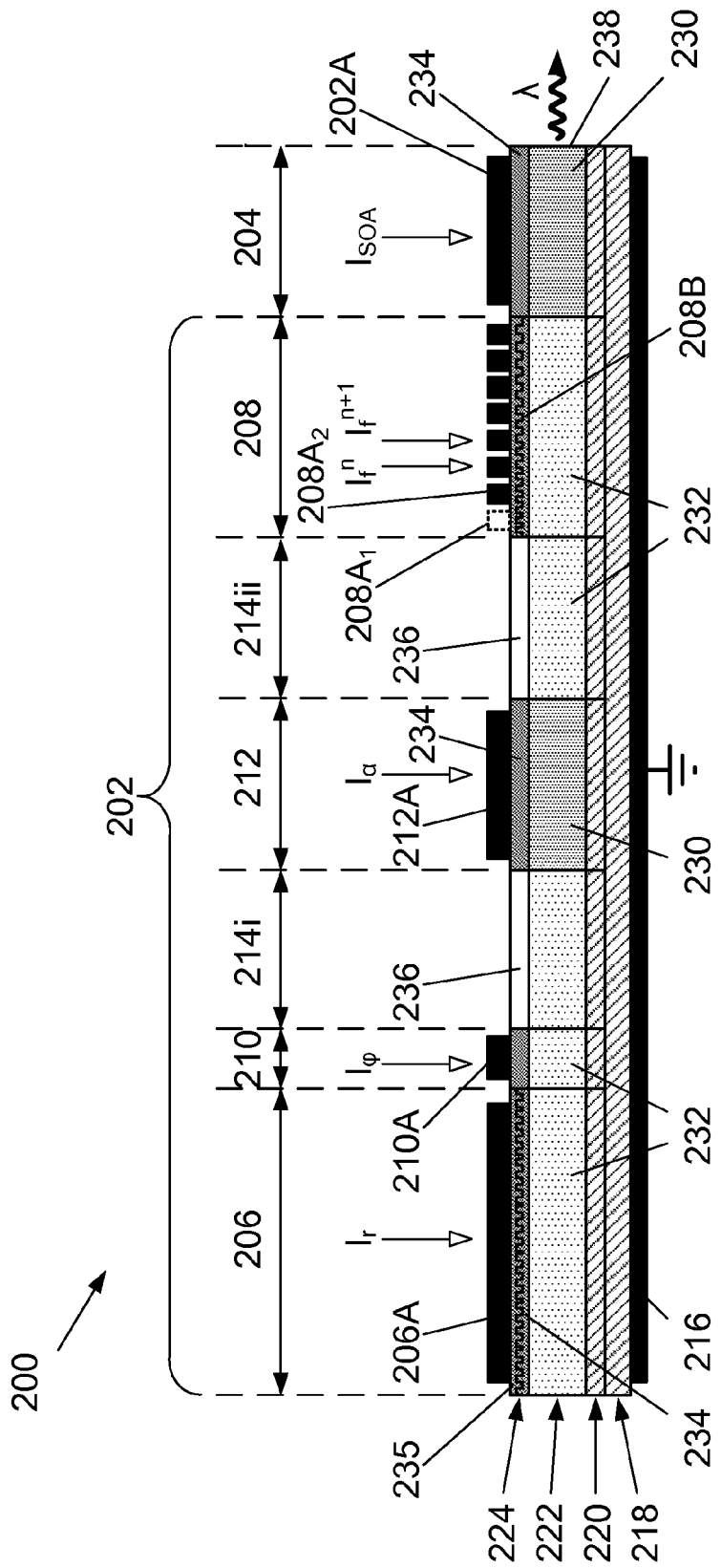
FIG. 2 illustrates a schematic cross-sectional view of a semiconductor chip comprising a tunable semiconductor laser having a plurality of passive sections and a phase control section.

FIG. 2 illustrates a chip 200 with a monolithically integrated semiconductor laser 202 that has two passive subsections, 214*i* and 214*ii*, on either side of the gain section 212, being the two locations of the laser cavity in which the optical field strength is typically greatest, in use. Also, in contrast to the passive section 114 of the laser 102 in FIG. 1, the material 236 in the overgrowth layer 224 of the passive section 214*i* and 214*ii* is undoped. P-type doped material typically induces greater optical losses than n-type or undoped material. Accordingly, in the case that the overgrowth layer in the electrically drivable sections 206, 208, 210 and 212 is p-type, provision of n-type or undoped material 236 in the overgrowth layer 224 of the passive section(s) 214*i* and 214*ii* can reduce the optical loss in the laser cavity.

Although in the laser 102 illustrated in FIG. 1A segmented electrodes 108A, are provided on each of the segments of the DBR section, one or more electrodes may be omitted from the segments at one or both ends of the DBR section. In particular, the electrode (e.g. 108A$_1$) or electrodes (e.g. 108A$_1$ and 108A$_2$) may be omitted from the DBR segment or segments in which the grating 108B has the shortest pitch (when not driven). However, such a DBR segment without a segmented control electrode does not form part of the non-driven regions, as in contrast it comprises a segment of reflective Bragg grating.

By way of illustration, in FIG. 2, an electrode (indicated in outline and labelled 208A$_1$) is omitted from the DBR segment in which the grating 208B has the shortest pitch (when not driven). Although not provided with an electrode, by which to be electrically controlled, the corresponding DBR segment is nonetheless regarded as part of the active DBR section 208, since the reflection spectra of one or more other DRB segments (e.g. segments that are spectrally adjacent when not driven, e.g. the segment beneath electrodes $108A_2$) may be tuned into spectral cooperation with it.

Figure 3:
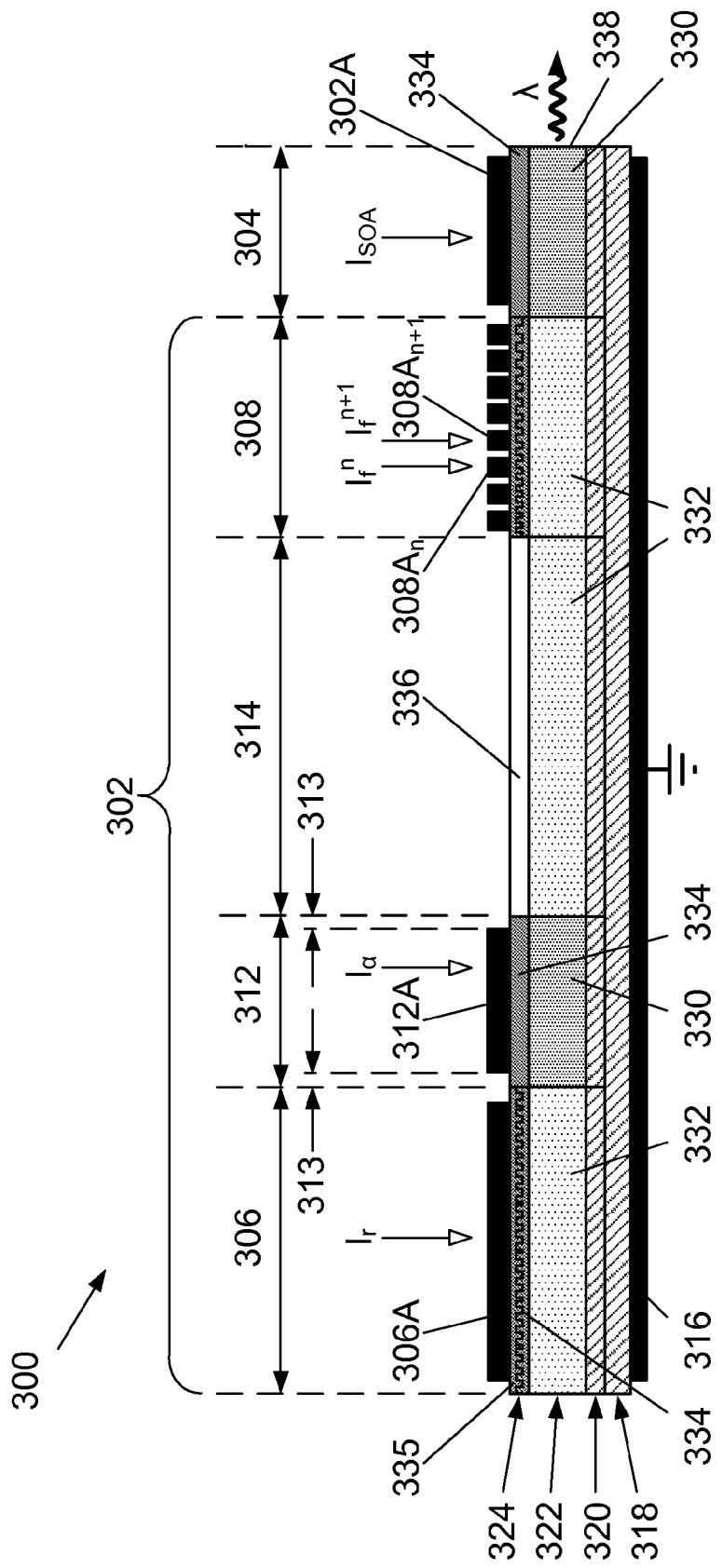
FIG. 3 illustrates a schematic cross-sectional view of a semiconductor chip comprising a tunable semiconductor laser optically integrated on a common optical waveguide with a semiconductor optical amplifier, having a passive section.
Figure 4:
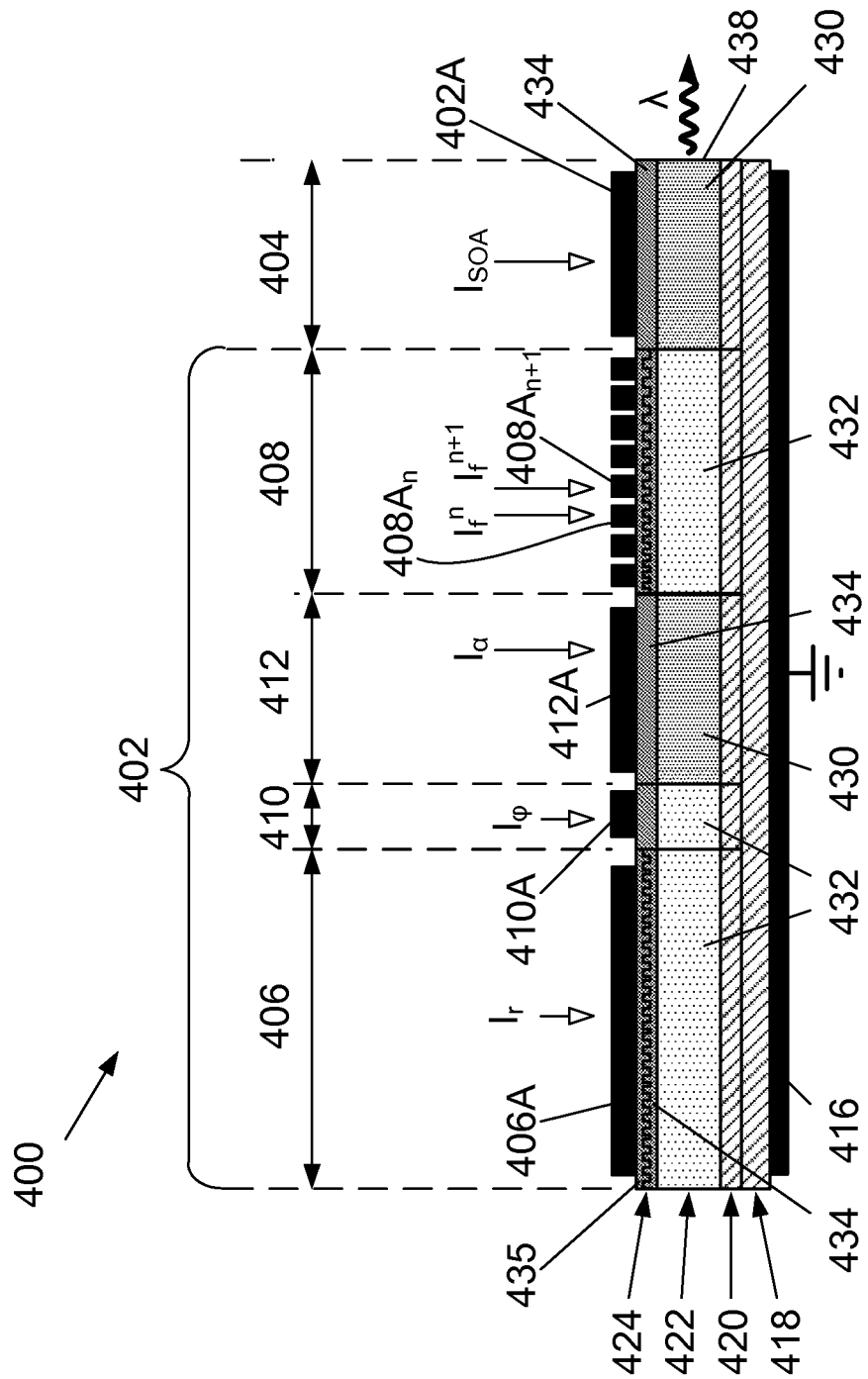
FIG. 4 illustrates a schematic cross-sectional view of a semiconductor chip comprising a tunable semiconductor laser optically integrated on a common optical waveguide with a semiconductor optical amplifier, having a phase control section.

FIG. 1A illustrates a laser having both a non-driven region of at least 100 µm in length (e.g. having a passive section of at least 100 µm in length) and a phase section of less than 80 µm in length, that is operable with a high, frequency response bandwidth under single mode lasing conditions. However, it will be appreciated that alternatively a laser may be provided having only a non-driven region of at least 100 µm in length (e.g. having a passive section 314 of at least 100 µm in length) or a phase section 410 of less than 80 µm in length having a high frequency response bandwidth, as is illustrated in the monolithically integrated tunable semiconductor lasers 302 and 402 of FIGS. 3 and 4 respectively.

Figure 5:
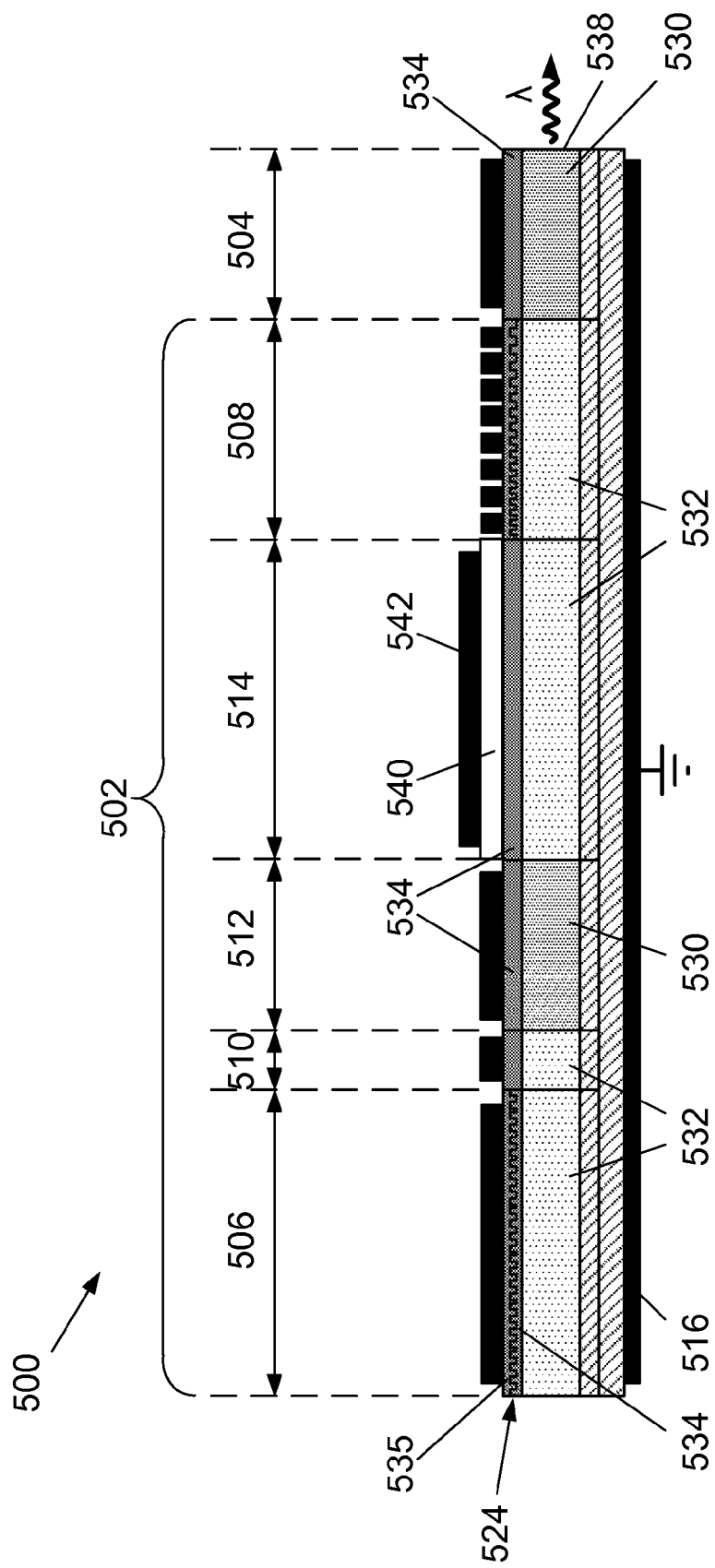
FIG. 5 illustrates a schematic cross-sectional view of a semiconductor chip comprising a tunable semiconductor laser, having a passive section and a phase control section, and having an insulating layer over the passive section.

FIG. 5 illustrates a further arrangement of a monolithically integrated tunable semiconductor laser 502, in which the overgrowth layer 524 of the passive section 514 is the same as the overgrowth layer 524 in the DBR sections 506 and 508 and the phase control section 510. The chip 500 is also provided with an electrically insulating layer (e.g. dielectric) 540 across the passive section 514. Such an electrically insulating layer 540 can enable the provision of an electrode or electrical tracking 542 to pass across the passive section 514, without electrically interacting with the passive section. Such a design can facilitate a lower level of complexity in the manufacture of the chip 500. For example, if the passive section is provided adjacent the phase control section, and an electrically insulating layer is provided on the passive section, then a longer phase section electrode may be provided which covers both the passive and phase control section, but which only electrically contacts the laser in the phase control section.

Figure 6:
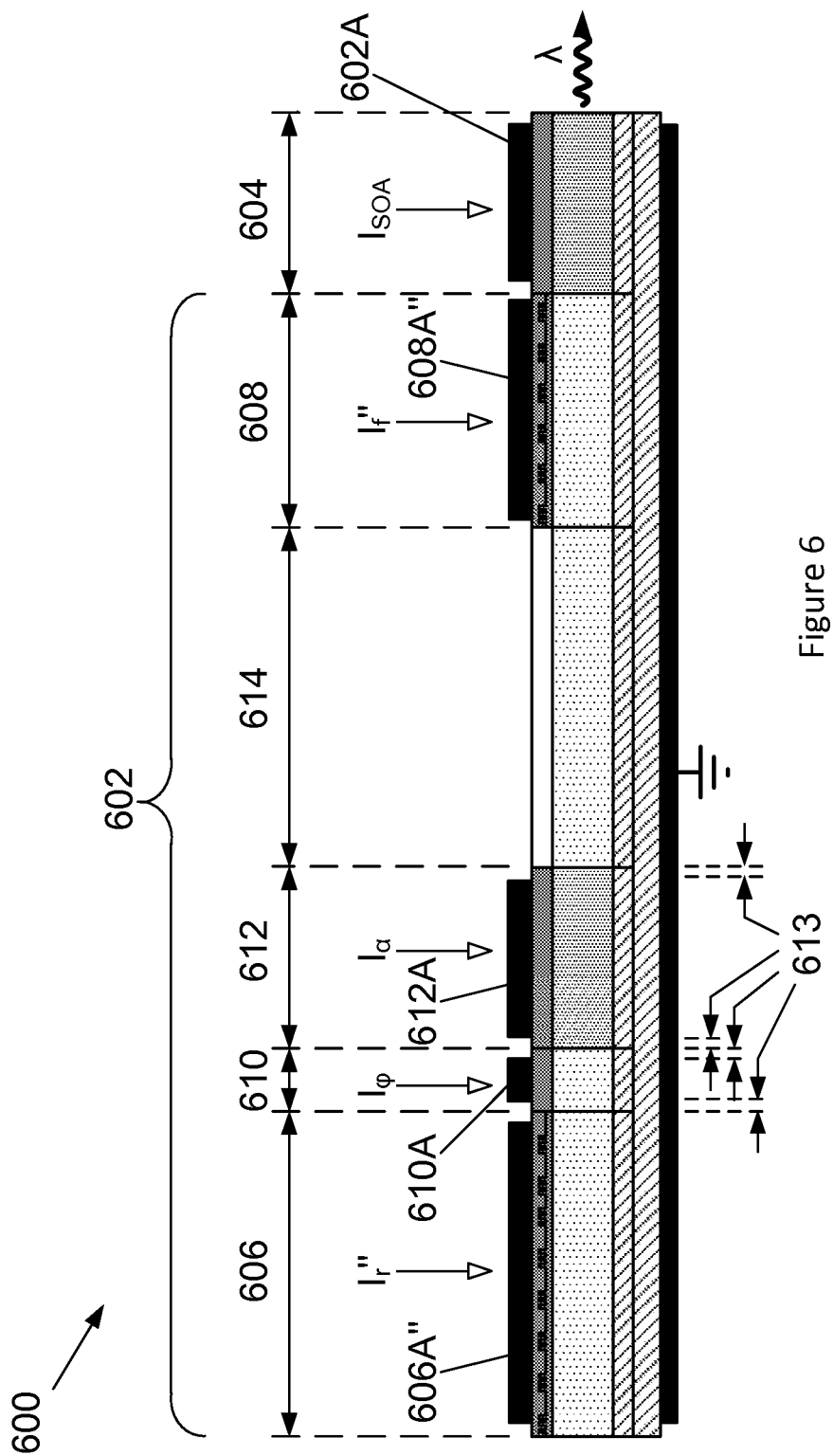
FIG. 6 illustrates a schematic cross-sectional view of a semiconductor chip comprising a further tunable semiconductor laser optically integrated on a common optical waveguide with a semiconductor optical amplifier, having a passive section and a phase control section.

FIG. 6 illustrates an optoelectronic chip 600 having an alternative design of monolithically integrated semiconductor laser 602. The laser 602 differs from that of FIG. 1A by the second DBR section 608 being tunable by a single control electrode 608A. This arrangement is suitable for a Vernier-tuned laser 602, in which the first and second DBR sections 606 and 608 each provide a comb of narrow reflective peaks, but which are differently spaced, so that by relative tuning it is possible to tune the DBR sections such that a reflective peak from each DBR section is tuned to the same wavelength, producing a low round trip optical loss within the cavity at that wavelength, in order to control the lasing of the cavity to that wavelength when sufficient optical gain is provided by the gain section 612. Again, a non-driven region is provided by the electrical isolation gaps 613 and the passive section 614.

Figure 7:
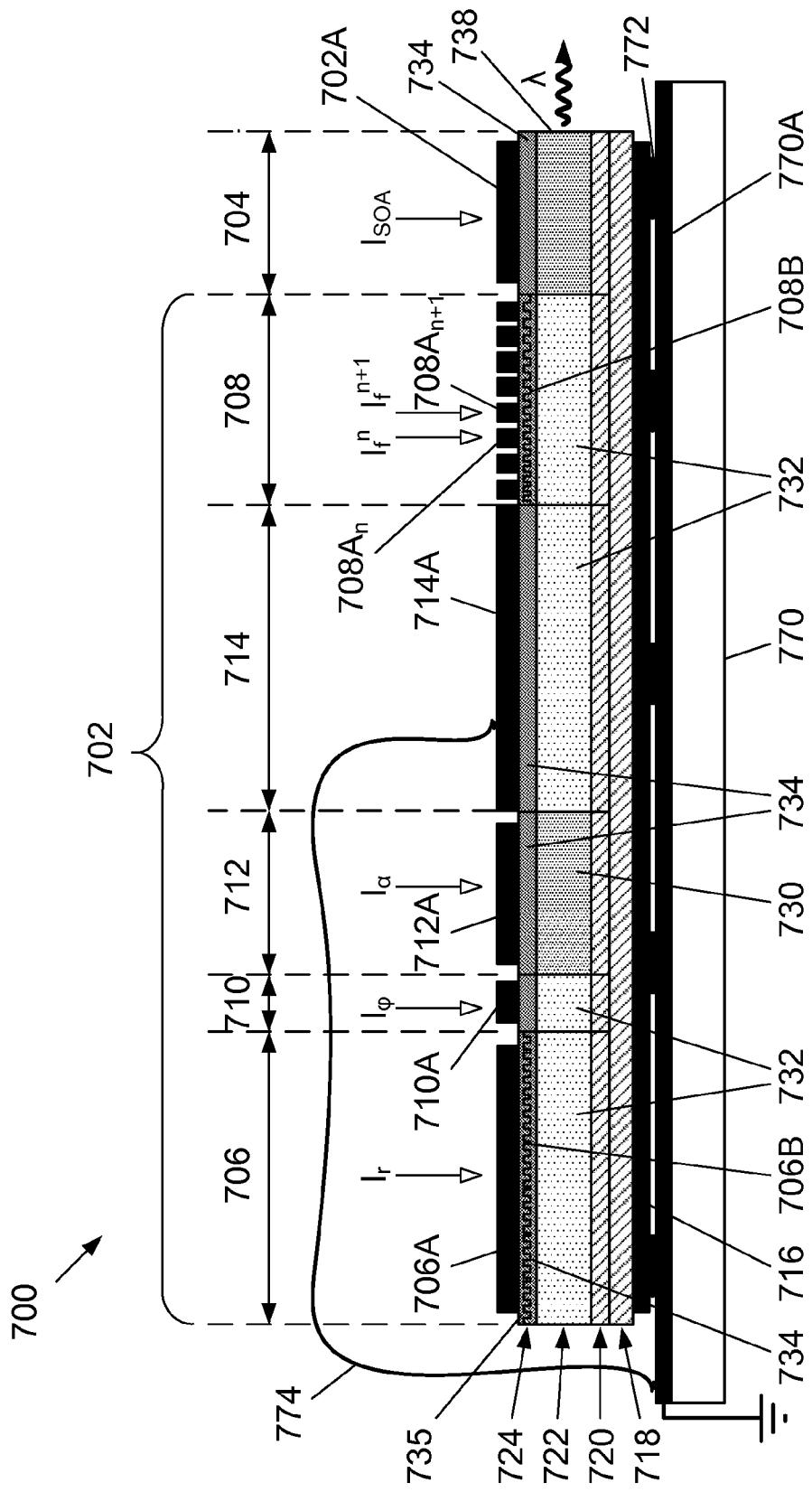
FIG. 7 illustrates a schematic cross-sectional view of a semiconductor chip comprising a tunable semiconductor laser optically integrated on a common optical waveguide with a semiconductor optical amplifier, having a grounded passive section.

FIG. 7 illustrates a schematic cross-sectional view of an optoelectronic semiconductor chip 700 having a tunable semiconductor laser 702 optically integrated on a common optical waveguide with a semiconductor optical amplifier (SOA) 704, which is outside the cavity of the laser. The laser 702 has first and second distributed Bragg reflector (DBR) sections 706 and 708 bounding a phase control section 710, an optical gain section 712 and a grounded passive section 714. The sections 706, 708, 710, 712 and 714 of the laser 702 are monolithically integrated on the common semiconductor chip 700.

The chip 700 is provided with a grounded common earth electrode 716 (also referred to as the "back electrode") onto the substrate 718. The first DBR section 706, the phase control section 710, the optical gain section 712, and the SOA 704 are provided with respective electrical control electrodes, 706A, 710A, 712A and 704A. The grounded passive section 714 is provided with an electrically grounded electrode 714A onto the side of the chip 700 opposite to the common earth electrode 716 (e.g. in the case of a ridge waveguide laser, the electrically grounded electrode 714A is provided onto the ridge). No reflective Bragg grating is provided within the grounded passive section 714. The first DBR section 706 comprises a reflective Bragg grating 706B that produces a reflection spectrum with a comb of reflective peaks. The second DBR section 708 comprises a reflective Bragg grating 708B with a monotonically chirped grating pitch, with respective sub-electrodes $708A_1$, $708A_2$, etc. provided on segments of the second DBR section arranged along the optical waveguide.

As is conventional in optoelectronic structures, the chip 700 comprises a common substrate 718 and a series of epitaxially grown layers successively built up on the substrate, being a lower layer 720, an optical guiding layer 722, and an overgrowth layer 724. Further layers may also be provided (e.g. a patterned layer of highly doped material may be provided beneath the electrodes, and the electrodes may be deposited through windows patterned in an electrically insulating layer, both omitted from FIG. 7 for clarity), and each layer may comprise a plurality of layers.

A ridge optical waveguide (not shown) is formed by etching a ridge into at least the surface of the chip 700 opposite to the substrate 718, and the ridge optical waveguide provides lateral guiding of light within the laser 702 and SOA 704. In the case of a shallow ridge waveguide, it may be etched only part way through the overgrowth layer 724. In the case of a deeper ridge waveguide, it may be etched through the overgrowth layer 724, the optical guiding layer 722 and into the lower layer 720. The ridge waveguide is dimensioned to support only a single transverse optical mode of the lasing wavelength, including within the grounded passive section 714.

The optical guiding layer 722 is intrinsic, undoped semiconductor material (i.e. not intentionally doped, i-type), and the optical guiding layer has a higher refractive index than the lower layer 720 or the overgrowth layer 724. In at least the electrically drivable sections of the laser 706, 708, 710 and 712 and in the grounded passive section 714, the lower layer 720 is doped with dopants of a first type (e.g. n-type). Similarly, in at least the electrically drivable sections of the laser 706, 708, 710 and 712 and in the grounded passive section 714, the overgrowth layer 724 is doped with dopants of the opposite, second type (e.g. p-type). Accordingly, at least the electrically drivable sections of the laser 706, 708, 710 and 712 comprise p-i-n doped epitaxial structures, enabling current injection into the respective portion of the optical guiding layer 720. Further, the grounded passive section 714 comprises a p-i-n doped epitaxial structure, enabling electrical charge carriers (i.e. electrons and holes) that have been photogenerated by optical absorption to flow out from the respective portion of the optical guiding layer 720.

The optical gain section 712 of the laser and the SOA 704 comprise an optical guiding layer 722 formed of a first material 730. The first and second DBR sections 706 and 708, the phase control section 710 and the grounded passive section 714 comprise an optical guiding layer formed of a second material 732, to optimise their respective optical and electrical performance. The first material 730 is configured for being electrically driven by carrier injection to emit photons, in particular by stimulated emission, thereby amplifying light that passes through the corresponding sections 712 and 704. The second material 732 is configured for being electrically driven by carrier injection to produce a refractive index change within the corresponding section 706, 708 and 710. The second material 732 is also suited to use in the optical guiding layer of the grounded passive section 714, having lower optical absorption than the first material 730. The laser 702 and SOA 704 are provided with an overgrowth layer 724 comprising a common third material 734 of the second dopant type (e.g. p-type). Accordingly, in the illustrated laser 702, the grounded passive section 714 and the phase section 710 have the same epitaxial structure. In the DBR sections 706 and 708, the gratings 706B and 708B are formed by a corrugated boundary between the third material 734 and a further material 735 (e.g. also of the second dopant type) having a different refractive index, being formed by etching a corrugated pattern into the third material 734 before overgrowing with the further material 735.

The waveguide in the grounded passive section 714 is dimensioned to support only a single transverse mode of the laser cavity.

The grounded passive section 714 is a non-driven region of the optical waveguide within the laser cavity that is not configured to be electrically controlled with a drive current. However, the grounded passive section 714 is provided with an electrode 714A on its upper surface (i.e. the opposite side of the chip 700 from the common earth electrode 716) that is electrically connected to electrical ground (as is the common earth electrode 716) through a low resistance pathway (e.g. the pathway has a sufficiently low resistance to prevent the maximum photogenerated bias arising between the electrically grounded passive section electrode 714A and the common earth electrode 716 from reaching the switch-on voltage of the p-i-n diode structure in the grounded passive section 714, e.g. maintaining a bias of less than 0.5V, preferably less than 0.25V, and more preferably less than 0.1V). For example, the common earth electrode 716 of the optoelectronic semiconductor chip 700 may be bonded to an electrically grounded tile electrode 770A on an underlying tile 770 (e.g. bonded with solder 772 or electrically conductive cement), and the electrode 714A of the grounded passive section 714 may be electrically connected to the tile electrode by a wire bond 774 or by an electrically conducting hole (also known as a "via", and not illustrated) through the chip 700.

Accordingly, the laser 702 has a composite non-driven region within the optical waveguide of the lasing cavity, between the end reflectors of the laser cavity (e.g. between the first and second DBRs 706 and 708), comprising the grounded passive section 714 and the electrical isolation gaps in the driven sections 706, 708 and 710 and 712.

Accordingly, bounded by the first DBR section 706 and the second DBR section 708, the optical cavity of the laser 702 is provided with a non-driven region (that is an assembly of sub-regions that are not all adjacent) that is not electrically driven (in use) and is not provided with a grating, composed of electrical isolation gaps and the grounded passive waveguide section 714. The composite non-driven region has a length of at least 100 µm. The grounded passive section 714 alone may have a length of at least 100 µm. In the exemplary laser 702 of FIG. 7, the grounded passive section 714 has a length of 450 µm and each electrical isolation gap has a length of 10 µm (so that the non-driven region has a length of at least 500 µm).

The grounded passive section is at least 100 µm in length, and may have a length of at least 150 µm, at least 200 µm or at least 400 µm. In particular, lasers manufactured with grounded passive sections of at least 450 µm length have been found to provide substantially lower total linewidths than corresponding lasers without grounded passive sections within the optical cavity of the laser.

Aside from the differences discussed above, the structure and electrical operation of the laser 702 of FIG. 7 is similar to the structure and electrical operation of the laser 102 of FIG. 1A. Accordingly, the optical cavity of the laser 702 extends between the DBR sections 706 and 708, and penetrates into the DBR sections in accordance with the penetration distance of each DBR section, which in turn is dependent upon the strength of the grating 706B and 708B in each section (it is noted that alternatively one of the end reflectors of the lase cavity may be a reflective facet of the chip, for which there is no significant penetration distance). The presence of the length of the non-driven region (including the grounded passive section 714) within the lasing cavity of the laser 702 provides an increased laser cavity optical path length and consequently an increased round-trip time for photons within the cavity, which reduces the spontaneous emission rate of the photons contributing to the lasing mode, and increases the population of photons within the laser cavity, advantageously resulting in the emission of light from the laser cavity that has a reduced Lorentzian linewidth, compared with a corresponding laser cavity without a non-driven region that is longer than necessary simply to provide electrical isolation (e.g. without a grounded passive section).

The presence of the grounded passive section further enhances the optical performance of the laser, relative to the provision of a corresponding passive section that is not electrically grounded both above and below. Optical absorption within the grounded passive section generates electrical carriers. However, the presence of photogenerated carriers would change the refractive index of the passive section in a way that would reduce the rate of optical absorption, causing a cycle that produces oscillations in the emission frequency of the emitted light $\lambda$. Further, photogenerated carrier would also recombine spontaneously within the optical guiding layer, which would contribute to the phase noise characteristic of the emitted light $\lambda$. Accordingly, by having a p-i-n structure that is grounded both above and below, the grounded passive section enables photogenerated electrical charge carriers to flow rapidly out of the grounded passive section, thereby advantageously reducing the total linewidth of the emitted light $\lambda$, in particular reducing the contribution from shot noise.

The lower layer 720, optical guiding layer 722 or overgrowth layer 724 in the grounded passive section 714 may have a higher refractive index than the corresponding layers in one of the DBR sections 706 and 708, or in the phase section 710, which would further increase the optical path length of the laser cavity.

In FIG. 7, a single grounded passive section 714 has been illustrated, which is located between the optical gain section 712 and the (second) DBR section 708, which is partially transmissive and through which light exits the laser cavity towards the output facet 738. That location for the grounded passive section is advantageous, since it is the location in which the greatest optical field strength is present within the laser cavity, in use. However, a grounded passive section may be provided at an alternative location within the laser cavity (i.e. elsewhere between the first and second DBR sections 706 and 708). Further, more than one grounded passive section may be provided. For example, a grounded passive section may alternatively or additionally be provided between the first DBR section and the phase section, or between the phase section and the gain section.

Figure 8:
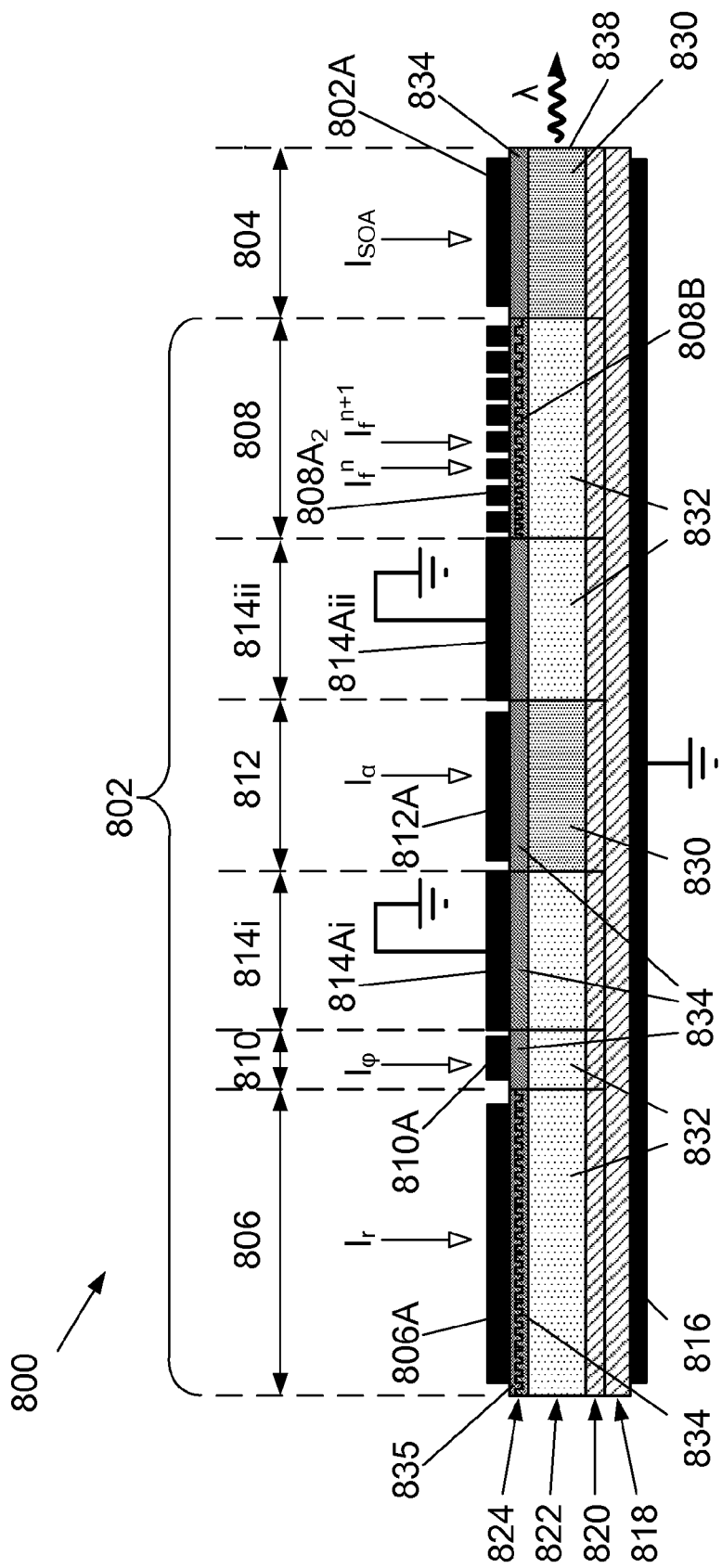
FIG. 8 illustrates a schematic cross-sectional view of a semiconductor chip comprising a tunable semiconductor laser having a plurality of grounded passive sections.

FIG. 8 illustrates a chip 800 with a monolithically integrated semiconductor laser 802 that has two grounded passive sub-sections, 814i and 814ii, with one grounded passive sub-section provided along the length optical waveguide, next to each end of the optical gain section 812. Advantageously, providing a sub-section 814i and 814ii of the grounded passive section on each side of the optical gain section 812 enables a distribution of photons throughout the laser cavity that enables further enhanced reduction in the total linewidth of emitted light λ.

The figures have illustrated the inclusion of a passive section (e.g. including a grounded passive section) within a DBR laser having DBRs at each end of the laser cavity. However, it will be appreciated that a passive section (grounded or otherwise) or a phase section having a frequency response bandwidth of greater than 50 MHz under single mode lasing conditions may be included within a laser in which one end of the laser cavity is provided by a DBR section and the other end is provided by a facet reflection.

Although the figures have illustrated the inclusion of a DBR laser having an unbranched optical waveguide, it will be appreciated that the DBR laser may have a branched optical waveguide. For example the DBR laser may have a Y-shaped optical waveguide, with a DBR reflector at the end of each waveguide arm, being optically coupled to a common reflector (e.g. facet reflector) by a waveguide splitter (e.g. 1×2 multimode interference coupler).

The figures have illustrated the inclusion of an unbranched passive section within a laser. However, it will be appreciated that a laterally (in plane) branched passive section may also be included within a laser.

The figures provided herein are schematic and not to scale.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A monolithically integrated, tunable semiconductor laser with an optical waveguide, comprising a laser chip having epitaxial layers on a substrate and having
   first and second reflectors bounding
   an optical gain section and
   a passive section that has a length of at least 100 μm,
   wherein at least one of the reflectors is a distributed Bragg reflector section comprising a grating and configured to have a tunable reflection spectrum,
   wherein the laser is provided with a common earth electrode that is electrically grounded,
   wherein control electrodes are provided on the optical waveguide in at least the optical gain section and the at least one distributed Bragg reflector section,
   wherein the passive section is provided with a passive section electrode that electrically contacts the opposite side of the optical waveguide from the substrate, the passive section is configured not to be drivable by an electrical control signal, and no grating is present within the passive section, and
   wherein the passive section is a grounded passive section in which the passive section electrode is an electrically grounded electrode that electrically contacts the passive section, and the passive section electrode and the common earth electrode electrically contact opposite sides of the optical waveguide.

2. The monolithically integrated, tunable semiconductor laser according to claim 1, wherein the common earth electrode is provided on the substrate, the common earth electrode is bonded to a mounting element electrode provided on a mounting element, and the passive section electrode is electrically connected to the mounting element electrode.

3. The monolithically integrated, tunable semiconductor laser according to claim 1, wherein an electrically insulating layer is provided on the optical waveguide in the passive section, and the passive section electrode is provided on the electrically insulating layer.

4. The monolithically integrated, tunable semiconductor laser according to claim 1, wherein the grounded passive section comprises a p-i-n doped epitaxial structure.

5. The monolithically integrated, tunable semiconductor laser according to claim 1, wherein the laser comprises a substrate, a lower layer on the substrate, an overgrowth layer and an optical guiding layer between the lower layer and the overgrowth layer,
   wherein the optical waveguide has an optical phase control section bounded by the first and second reflectors, and
   the phase control section and the passive section comprises a common overgrowth layer and/or lower layer.

6. The monolithically integrated, tunable semiconductor according to claim 1, wherein the laser comprises a plurality of passive sub-sections.

7. The monolithically integrated, tunable semiconductor laser according to claim 1, wherein a reflector is an output reflector that is configured for optical output from the laser, and the passive section or a passive sub-section is located between the optical gain section and the output reflector.

8. The monolithically integrated, tunable semiconductor laser according to claim 1, wherein the optical waveguide has an optical phase control section bounded by the first and second reflectors, and the passive section or a passive sub-section is located between the optical gain section and the optical phase control section.

9. The monolithically integrated, tunable semiconductor laser according to claim 1, wherein the passive section has a length of at least 150 μm.

10. The monolithically integrated, tunable semiconductor laser according to claim 9, wherein the passive section has a length of at least 200 μm.

11. The monolithically integrated, tunable semiconductor laser according to claim 10, wherein the passive section has a length of at least 400 μm.

12. A monolithically integrated, tunable semiconductor laser array comprising a plurality of lasers according to claim 1 optically coupled to a common optical output.

13. An optical transmitter module comprising a monolithically integrated, tunable semiconductor laser according to claim 1, or an array thereof, and control electronics configured to control the operation of the monolithically integrated, tunable semiconductor laser or the array thereof.

14. The optical transmitter module according to claim 13, wherein the control electronics comprises a control loop configured to sample the wavelength of light output from the laser or laser array and to provide electrical feedback to control electrodes provided on the laser or laser array.

15. A monolithically integrated, tunable semiconductor laser with an optical waveguide, comprising a laser chip having epitaxial layers on a substrate and having
first and second reflectors bounding
an optical gain section and
a grounded passive section that has a length of at least 100 µm,
wherein at least one of the reflectors is a distributed Bragg reflector section comprising a grating and configured to have a tunable reflection spectrum,
wherein the laser is provided with a common earth electrode that is electrically grounded,
wherein control electrodes are provided on the optical waveguide in at least the optical gain section and the at least one distributed Bragg reflector section,
wherein the grounded passive section is provided with a passive section electrode that electrically contacts the opposite side of the optical waveguide from the substrate and that is electrically connected to the common earth electrode, and no grating is present within the grounded passive section,
wherein the passive section electrode is an electrically grounded electrode that electrically contacts the grounded passive section, and the passive section electrode and the common earth electrode electrically contact opposite sides of the optical waveguide.

16. A monolithically integrated, tunable semiconductor laser on a substrate and having an optical gain section, an optical phase control section, a common earth electrode that is electrically grounded, and a grounded passive section that has a length of at least 100 µm, the grounded passive section bounded at one end by a tunable first Bragg reflector in the form of a distributed Bragg reflector adapted to produce a comb of reflective peaks and at the other end by a tunable second distributed Bragg reflector, the second distributed Bragg reflector being adapted to reflect at a plurality of wavelengths, wherein one or more wavelengths of reflective peaks of the first distributed Bragg reflector substantially coincide with one or more wavelengths at which the tunable second distributed Bragg reflector reflects prior to each of the first and second distributed Bragg reflectors being tuned, and wherein the second distributed Bragg reflector is capable of being tuned selectively through discrete segments so that one or more segments of the second distributed Bragg reflector can be tuned to a lower wavelength to reflect with a further segment of the second distributed Bragg reflector reflecting at that lower wavelength to enhance the reflectivity at that lower wavelength, the lower wavelength substantially coinciding with a peak of the first distributed Bragg reflector, thereby capable of causing the laser to lase at that lower wavelength, wherein the passive section is provided with a passive section electrode that electrically contacts the opposite side of the optical waveguide from the substrate, the grounded passive section is configured not to be drivable by an electrical control signal, and no grating is present within the grounded passive section, wherein the passive section electrode is an electrically grounded electrode that electrically contacts the grounded passive section, and the passive section electrode and the common earth electrode electrically contact opposite sides of the optical waveguide.

* * * * *